(12) United States Patent
Bovington et al.

(10) Patent No.: US 10,725,240 B2
(45) Date of Patent: Jul. 28, 2020

(54) LASER SPARING FOR PHOTONIC CHIPS

(71) Applicant: Cisco Technology, Inc., San Jose, CA (US)

(72) Inventors: Jock T. Bovington, La Mesa, CA (US); Matthew J. Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/132,109

(22) Filed: Sep. 14, 2018

(65) Prior Publication Data

US 2020/0088940 A1   Mar. 19, 2020

(51) Int. Cl.
   *G02B 6/12*    (2006.01)
   *H01S 5/026*   (2006.01)
   *H04B 10/25*   (2013.01)

(52) U.S. Cl.
   CPC ........ *G02B 6/12019* (2013.01); *H01S 5/0265* (2013.01); *H01S 5/0268* (2013.01); *H04B 10/25* (2013.01)

(58) Field of Classification Search
   CPC ... G02B 6/12019; H04B 10/25; H01S 5/0268; H01S 5/0265
   See application file for complete search history.

(56) References Cited

U.S. PATENT DOCUMENTS

| | | | | |
|---|---|---|---|---|
| 9,118,411 | B1* | 8/2015 | Schmidt | H04B 10/035 |
| 2002/0145778 | A1* | 10/2002 | Strasser | G02B 6/29367 398/7 |
| 2005/0213972 | A1* | 9/2005 | Aoki | H04B 10/032 398/49 |
| 2016/0285557 | A1* | 9/2016 | Flens | H04B 10/032 |

OTHER PUBLICATIONS

Takayuki Okamoto and Ichirou Yamaguchi, "Multimode fiber-optic Mach-Zehnder interferometer and its use in temperature measurement," Appl. Opt. 27, 3085-3087 (1988) (Year: 1988).*

* cited by examiner

*Primary Examiner* — Ryan A Lepisto
*Assistant Examiner* — Erin D Chiem
(74) *Attorney, Agent, or Firm* — Patterson + Sheridan, LLP

(57) ABSTRACT

A method comprises receiving, at a plurality of optical distributors of a photonic chip, optical energy from a plurality of primary laser sources. Each of the optical distributors receives optical energy from a respective primary laser source at a respective first input. The method further comprises detecting a failed primary laser source of the primary laser sources using control circuitry of a sparing system. The sparing system further comprises one or more secondary laser sources configured to provide optical energy to respective second inputs of the optical distributors. A first one of the secondary laser sources is optically coupled with at least two of the optical distributors. The method further comprises controlling, using the control circuitry, a first one of the secondary laser sources to selectively provide optical energy to the optical distributor whose first input is optically coupled with the failed primary laser source.

20 Claims, 5 Drawing Sheets

LASER SPARING FOR PHOTONIC CHIPS

TECHNICAL FIELD

Embodiments presented in this disclosure generally relate to laser sparing for photonic chips.

BACKGROUND

Modern optical networking systems continue to provide increased bandwidth, often through increasing the number of parallel optical links. However, the circuitry required to support larger numbers of parallel optical links may result in high power density, and acceptable performance of laser sources may require the laser sources to be implemented separately from photonic chips. Additionally, increased numbers of parallel optical links tend to require increased numbers of laser sources. Furthermore, semiconductor-based laser sources may have a significant impact on the overall reliability of the optical networking system.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
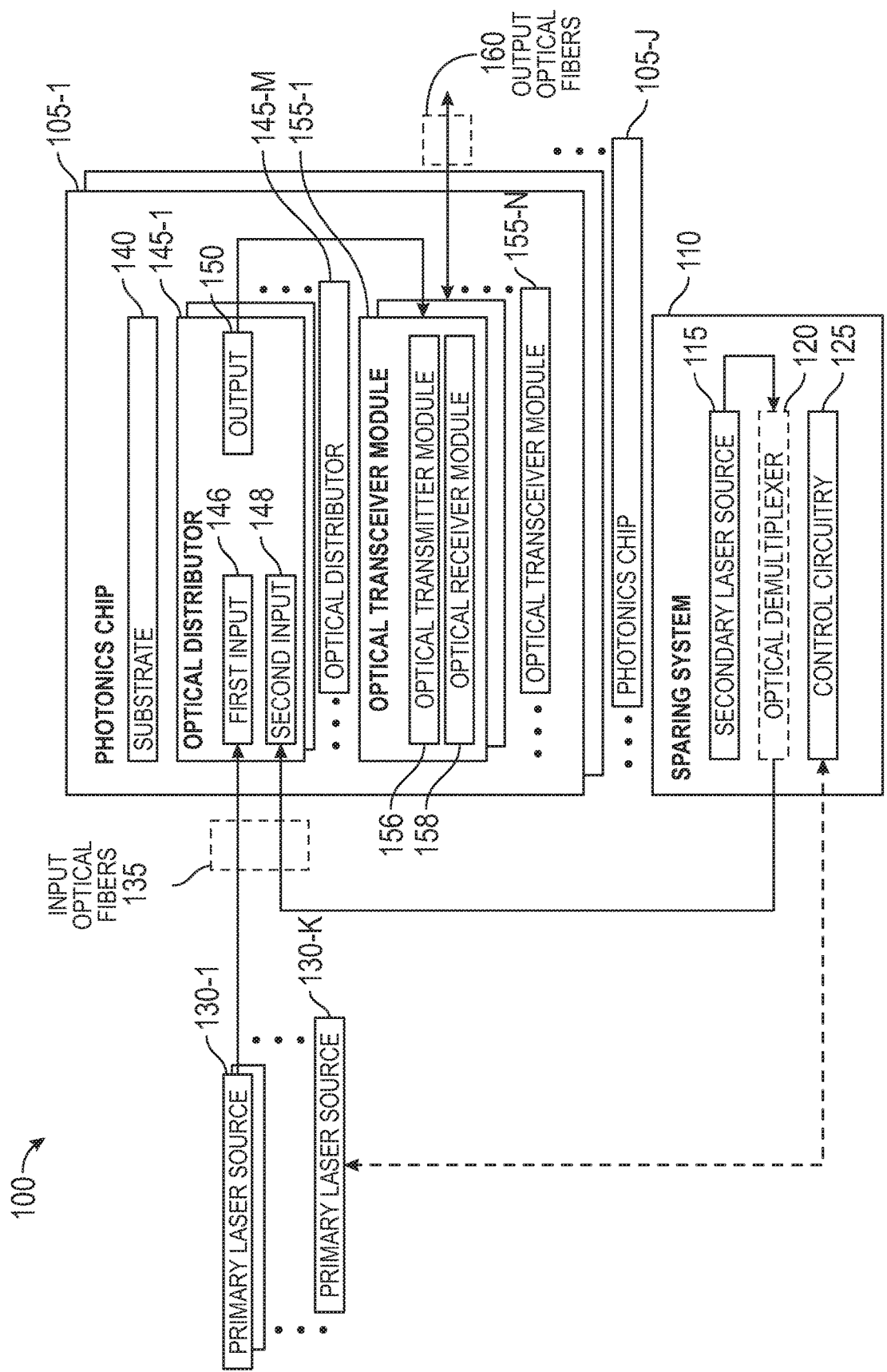
FIG. 1 is a block diagram of an exemplary apparatus comprising a plurality of photonic chips and a sparing system, according to one or more embodiments.

One embodiment presented in this disclosure is an apparatus comprising a photonic chip comprising a plurality of optical distributors, wherein each of the optical distributors comprises a first input, a second input, and an output. The apparatus further comprises a plurality of primary laser sources, wherein the first input of each of the optical distributors is optically coupled with a respective primary laser source. The apparatus further comprises a sparing system comprising one or more secondary laser sources, wherein the second input of each of the optical distributors is optically coupled with a respective secondary laser source, wherein a first one of the secondary laser sources is optically coupled with at least two of the optical distributors. The sparing system further comprises control circuitry configured to, responsive to detecting a failed primary laser source of the primary laser sources, control the first one of the secondary laser sources to selectively provide optical energy to the optical distributor whose first input is optically coupled with the failed primary laser source.

Another embodiment is a photonic chip comprising a substrate comprising a semiconductor material, a plurality of optical transceiver modules formed in the substrate and a plurality of optical distributors formed in the substrate. Each of the optical distributors comprises a first input configured to optically couple with a respective primary laser source of a plurality of primary laser sources, a second input configured to optically couple with a respective secondary laser source of one or more secondary laser sources, and an output configured to optically couple with a respective one of the optical transceiver modules. At least two of the optical distributors are configured to optically couple with a common secondary laser source. The photonic chip further comprises control circuitry formed in the substrate, wherein the control circuitry is configured to, responsive to detecting a failed primary laser source of the primary laser sources, control the common secondary laser source to selectively provide optical energy to the optical distributor whose first input is optically coupled with the failed primary laser source.

Another embodiment is a method comprising receiving, at a plurality of optical distributors of a photonic chip, optical energy from a plurality of primary laser sources. Each of the optical distributors receives optical energy from a respective primary laser source at a respective first input. The method further comprises detecting a failed primary laser source of the primary laser sources using control circuitry of a sparing system. The sparing system further comprises one or more secondary laser sources configured to provide optical energy to respective second inputs of the optical distributors. A first one of the secondary laser sources is optically coupled with at least two of the optical distributors. The method further comprises controlling, using the control circuitry, a first one of the secondary laser sources to selectively provide optical energy to the optical distributor whose first input is optically coupled with the failed primary laser source.

Example Embodiments

According to various embodiments, a photonic chip comprises a plurality of optical distributors. A primary laser source is optically coupled with a first input of an optical distributor of the plurality of optical distributors, and a secondary laser source of a sparing system is optically coupled with the second input of the optical distributor. An output of the optical distributor may be optically coupled with an optical transceiver module. In some embodiments, the secondary laser source may be optically coupled with at least one other optical distributor of the plurality of optical distributors. Control circuitry of the sparing system is configured to, responsive to detecting a failed primary laser source, control the secondary laser source to selectively provide optical energy to the optical distributor whose first input is optically coupled with the failed primary laser source.

Beneficially, the reliability of the system including the photonic chip may be improved by providing the secondary laser source. Stated another way, using the secondary laser source, the optical transceiver module may continue to operate despite a failure of the primary laser source. Additionally, the secondary laser sources may be configured to provide optical energy to multiple channels, which reduces cost (e.g., fewer components, fewer steps of aligning optical fibers with the photonic chip) and/or size. Further, sharing secondary laser sources between different optical distributors allows the techniques to be scaled up for very large numbers of optical channels.

FIG. 1 is a block diagram of an exemplary apparatus 100 comprising a plurality of photonic chips 105-1, ..., 105-J (generically referred to as a photonic chip 105) and a sparing system 110, according to one or more embodiments. The apparatus 100 may have any suitable form, such as an optical networking device having a massively parallel optical interface. Another non-limiting example of the apparatus 100 includes an optical power supply, e.g., for aviation applications. The photonic chips 105-1, ..., 105-J may have any suitable optical and/or electrical functionality. In some embodiments, a photonic chip 105 comprises one or more optical transceiver modules 155-1, ..., 155-N, which are discussed below.

Each photonic chip 105 comprises a substrate 140 comprising a semiconductor material. In some embodiments, the substrate 140 comprises a silicon on insulator substrate. In other embodiments, the substrate 140 may be formed of any other suitable semiconductor material(s), which may include elemental semiconductors (such as silicon) and/or compound semiconductors (such as group III-V semiconductor materials).

Each photonic chip 105 is configured to receive optical energy from a plurality of primary laser sources 130-1, ..., 130-K (generically referred to as a primary laser source 130). In some embodiments, the photonic chip 105 comprises input optical waveguides formed in the substrate 140, which are optically coupled with the primary laser sources 130-1, ..., 130-K. In some embodiments, the primary laser sources 130-1, ..., 130-K are optically coupled with the photonic chip 105 via a plurality of input optical fibers 135.

In some embodiments, the primary laser sources 130-1, ..., 130-K are implemented separate from the photonic chip 105. In other embodiments, the primary laser sources 130-1, ..., 130-K are implemented in the photonic chip 105. The primary laser sources 130-1, ..., 130-K may be formed of any suitable semiconductor material(s), which may include elemental semiconductors (such as silicon) and/or compound semiconductors (such as group III-V semiconductor materials). Some non-limiting examples include gallium arsenide (GaAs), aluminum gallium arsenide (AlGaAs), gallium phosphide (GaP), indium gallium phosphide (InGaP), gallium nitride (GaN), indium gallium arsenide (InGaAs), indium gallium arsenide nitride (GaInNAs), indium phosphide (InP), gallium indium phosphide (GaInP), and so forth.

In some embodiments, a plurality of optical distributors 145-1, ..., 145-M (generically referred to as an optical distributor 145) is formed in the substrate 140. The optical distributors 145-1, ..., 145-M comprise a plurality of inputs (e.g., a first input 146 and a second input 148) and one or more outputs (e.g., output 150). Generally, each optical distributor 145 receives optical energy from a primary laser source 130 on the first input 146, and receives optical energy from a secondary laser source 115 on the second input 148. In some cases, the number of optical distributors 145 and the number of primary laser sources 130 correspond to each other in a 1:1 ratio, but other ratios are also possible. The optical distributors 145 may comprise additional inputs and/or outputs for receiving and/or directing optical energy.

The optical distributor 145 outputs optical energy on the output 150. The optical distributors 145 may have any suitable implementation, such as a multimode interferometer, an optical multiplexer, and so forth. In some embodiments, each optical distributor 145 comprises a single output (e.g., an optical multiplexer). In other embodiments, each optical distributor 145 comprises a plurality of outputs (e.g., a multimode interferometer). In some alternate embodiments, the optical distributor 145 comprises an optical splitter having a single input and multiple outputs.

The apparatus 100 further comprises a sparing system 110 configured to selectively provide optical energy to optical distributors 145 of the photonic chip 105. The sparing system 110 comprises one or more secondary laser sources 115. In some embodiments, the secondary laser source(s) 130 may have the same properties as the primary laser sources 130. In other embodiments, the secondary laser source(s) 130 may have different properties than the primary laser sources 130 (e.g., different types, different power levels, and so forth). In some embodiments, each of the primary laser sources 130 comprises a single mode laser, and the secondary laser source 115 comprises one of a single mode laser, a tunable laser, and a switchable laser.

In some embodiments, some or all of the sparing system 110 is implemented separate from the photonic chip 105. Stated another way, a portion of the sparing system 110 may be implemented in the photonic chip 105. In other embodiments, the sparing system 110 is fully implemented in the photonic chip 105.

The sparing system 110 further comprises control circuitry 125 configured to detect a failed primary laser source 130. The control circuitry 125 may be further configured to control the secondary laser source 115 to selectively provide optical energy to the optical distributor 145 whose first input 146 is optically coupled with the failed primary laser source 130. In some embodiments, the control circuitry 125 is configured to transmit a control signal to energize the secondary laser source 115.

In some embodiments, the sparing system 110 comprises one or more optical demultiplexers 120 that are configured to direct (or distribute) optical energy from the secondary laser source 115 to selected one(s) of the optical distributors 145. In this way, a particular secondary laser source 115 may be optically coupled with at least two of the optical distributors 145. By sharing a particular secondary laser source 115 between different optical distributors 145, the sparing system 110 may be scaled up to support very large numbers of optical channels. For example, the apparatus 100 may support as 32 optical channels, 64 optical channels, 128 optical channels, or more.

The one or more optical demultiplexers 120 may include active (e.g., electronically switched) and/or passive demultiplexers. One or more of the optical demultiplexers 120 may be included in the photonic chip 105, but this is not a requirement. The control circuitry 125 may be further configured to transmit a control signal to the optical demultiplexer 120 to direct optical energy from a secondary laser source 115 to a selected optical distributor 145.

In some embodiments, the secondary laser source 115 comprises a tunable laser source, and the control circuitry 125 is configured to transmit a control signal to control a wavelength of the tunable laser source. In such embodiments, the one or more optical demultiplexers 120 may comprise a wavelength demultiplexer, such that the optical energy from the tunable laser source is directed to the selected one or more of the optical distributors 145.

The wavelength demultiplexer may have any suitable implementation, such as an arrayed waveguide grating (AWG), a ring-based demultiplexer, an echelle grating, and so forth. In some cases, the channel spacing for the wavelength demultiplexer may conform to dense wavelength-division multiplexing (DWDM) channel spacing, but this is not a requirement. A tight channel spacing may be preferable, as tunable lasers targeting the DWDM specification may be more readily available, and as non-wavelength selective optical devices downstream of the optical demultiplexers 120 (e.g., the optical distributors 145) may exhibit lower dispersion.

In some embodiments, the secondary laser source 115 comprises a single mode laser source, and the control circuitry 125 is configured to transmit a control signal to energize the single mode laser source. In such embodiments, the one or more optical demultiplexers 120 may comprise an optical switch, and the control circuitry 125 is further configured to transmit a control signal to control the optical switch to direct the optical energy from the single mode laser source to the selected one or more of the optical distributors 145.

In some embodiments, the one or more optical demultiplexers 120 comprise a plurality of optical demultiplexers 120. Beyond selecting which optical distributor(s) 145 receive the optical energy from an optical demultiplexer 120, the control circuitry 125 in some cases is configured to control which secondary laser source 115 and/or which of the plurality of optical demultiplexers 120 is used to direct the optical energy to a particular optical distributor 145.

In some embodiments, the plurality of optical demultiplexers 120 comprise a first optical demultiplexer of a first type, and a second optical demultiplexer of a different, second type. For example, the plurality of optical demultiplexers 120 may comprise a wavelength demultiplexer and an optical switch.

The output 150 of the optical distributor 145 is optically coupled to an optical transceiver module 155-1 of the plurality of optical transceiver modules 155-1, . . . , 155-N (generically referred to as an optical transceiver module 155) formed in the substrate 140. In some embodiments, the optical distributors 145 and the optical transceiver modules 155 are optically coupled via waveguides formed in the substrate 140. The optical transceiver modules 155 are coupled with a plurality of output optical fibers 160.

In some embodiments, the optical transceiver modules 155 comprise an optical transmitter module 156 and an optical receiver module 158. For example, the optical transmitter module 156 may be configured to output modulated optical signals onto the output optical fibers 160, and the optical receiver module 158 may be configured to receive modulated optical signals via the output optical fibers 160. The optical transceiver modules 156 may perform other processing of the optical energy received from the primary laser sources 130 and/or the secondary laser sources 115.

Figure 2:
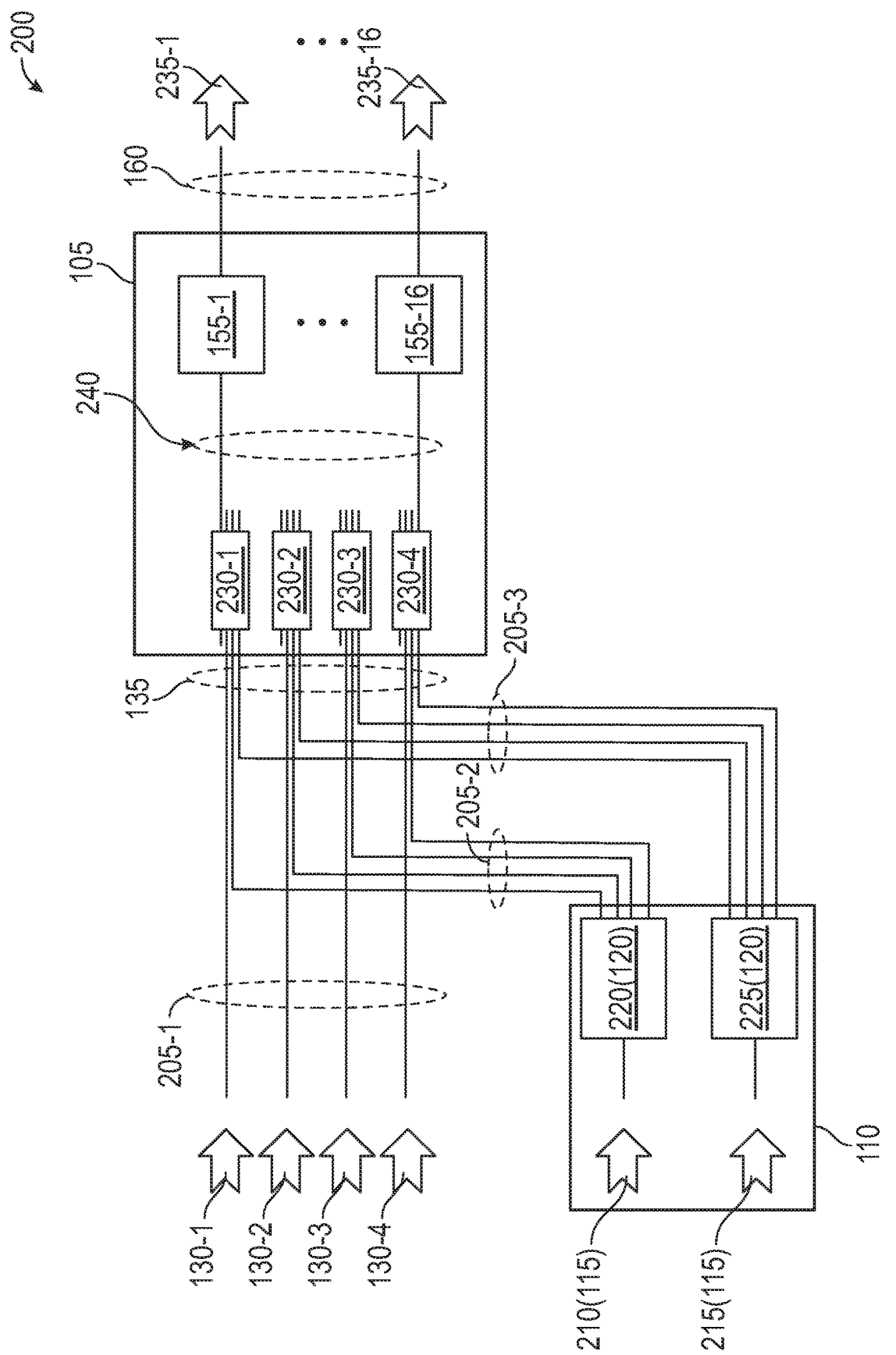
FIG. 2 is a diagram of an exemplary apparatus having a single photonic chip and a sparing system with a plurality of secondary laser sources, according to one or more embodiments.

FIG. 2 is a diagram of an exemplary apparatus 200 having a single photonic chip 105 and a sparing system 110 with a plurality of secondary laser sources 115, according to one or more embodiments. More specifically, the apparatus 200 represents one possible implementation of the apparatus 100 of FIG. 1. As shown, the apparatus 200 supports sixteen (16) optical channels 240 using four (4) primary laser sources 130-1, . . . , 130-4, although different numbers of primary laser sources and/or optical channels are also possible. The primary laser sources 130-1, . . . , 130-4 are implemented separate from the photonic chip 105.

The primary laser sources 130-1, . . . , 130-4 are optically coupled with multimode interferometers (MMIs) 230-1, 230-2, 230-3, 230-4 (generically, a MMI 230) of the photonic chip 105 via a first set 205-1 of the input optical fibers 135. The MMIs 230 represent one example of the optical distributors 145 of FIG. 1. The MMIs 230 distribute optical energy received on one or more of the inputs among the outputs. For example, the MMI 230-1 distributes the optical energy received at a first input from the primary laser source 130-1 among its four outputs. As shown, each of the MMIs 230 are in a 4×4 configuration (i.e., four inputs and four outputs), although other configurations are possible. For example, where the primary laser sources 130-1, . . . , 130-4 have a lesser optical power, the MMIs 230 may have fewer outputs (e.g., as few as two outputs) to ensure that sufficient optical power can be delivered to the downstream optical transceivers 155-1, . . . , 155-16. Conversely, where the primary laser sources 130-1, . . . , 130-4 have a greater optical power, the MMIs 230 may have more outputs (e.g., eight outputs) while ensuring that sufficient optical power can be delivered. Further, in an alternate configuration in which each of the MMIs 230 is optically coupled with a respective primary laser source 130-1, . . . , 130-4 and one secondary laser source 115, the MMIs 230 may have fewer inputs (e.g., as few as two inputs).

Thus, during operation of the apparatus 200, the photonic chip 105 receives optical energy from a plurality of primary laser sources 130-1, . . . , 130-4. Using the MMIs 230, the optical energy is distributed onto a plurality of optical channels 240, which is typically more numerous than the number of primary laser sources 130-1, . . . , 130-4. The MMIs 230 are also optically coupled with one or more secondary laser sources 115 of a sparing system 110 according to a laser sparing scheme. Responsive to a failure of a primary laser source 130-1, . . . , 130-4 for a particular MMI 230, a secondary laser source 115 optically coupled with the MMI 230 may be activated and/or controlled to provide optical energy to the MMI 230 to thereby maintain the optical channels 240 associated with the MMI 230.

In some embodiments, a corresponding optical switch is not needed for each of the MMIs 230, which tends to reduce a cost and a complexity of the photonic chip 105. In some embodiments, the secondary laser source 115 may be of a same type as the primary laser source 130-1, . . . , 130-4 (e.g., single mode laser sources), followed by an optical switch 220 that may be implemented on or off the photonic chip 105. In some embodiments, the sparing system 110 comprises a tunable laser source 215 that uses a wavelength demultiplexer 225 to perform spatial switching. Beneficially, the wavelength demultiplexer 225 provides a passive implementation that tends to reduce power consumption of the sparing system 110.

By distributing the optical power from the primary laser sources 130-1, . . . , 130-4 using the MMIs 230-1, . . . , 230-4, fewer laser sources can suitably operate and maintain the plurality of optical channels 240. Alternatively, optical multiplexers or other implementations of the optical distributors may be substituted for the MMIs 230.

The sparing system 110 comprises two secondary laser sources 115. More specifically, the sparing system 110 comprises a single mode laser source 210 and a tunable laser source 215. Thus, apparatus 200 represents a laser sparing scheme of two secondary laser sources 115 to four primary laser sources 130 (2:4).

An optical switch 220 is optically coupled with the single mode laser source 210, and a wavelength demultiplexer 225 is optically coupled with the tunable laser source 215. The optical switch 220 and the wavelength demultiplexer 225 are examples of the optical demultiplexers 120. The outputs of the optical switch 220 are optically coupled with each of the MMIs 230-1, . . . , 230-4 via a second set 205-2 of the input optical fibers 135. The outputs of the wavelength demultiplexer 225 are optically coupled with the MMIs 230-1, . . . , 230-4 via a third set 205-3 of the input optical fibers 135.

In some embodiments, the input optical fibers 135 are arranged in a fiber array (e.g., retained in an arrangement having predefined spacing). Beneficially, the input optical fibers 135 in the fiber array may be optically coupled with the photonic chip 105 (as shown, with the MMIs 230-1, . . . , 230-4) using as few as a single passive or active alignment process. Further, by implementing the MMIs 230-1, . . . , 230-4 (or other optical distributors) on the photonic chip 105, fewer laser sources and optical fibers 135 can support a particular number of optical channels 240. For example, twelve (12) optical fibers 135 support the connection of the MMIs 230-1, . . . , 230-4 with the primary laser sources 130-1, . . . , 130-4 and with multiple secondary laser sources 115. In contrast, a conventional apparatus might include sixteen (16) primary laser sources and sixteen (16) optical fibers and does not offer the improved reliability of the apparatus 200. As a result, costs and/or complexity associated with the apparatus 200 may be reduced.

In some embodiments, a complete overlap exists between the primary laser sources 130-1, . . . , 130-4 and the secondary laser sources 115. Stated another way, each optical distributor of the photonic chip 105 (e.g., the MMIs 230) that is optically coupled with a respective primary laser source 130-1, . . . , 130-4 is also optically coupled with at least one secondary laser source 115. Beneficially, such a configuration improves the reliability of the apparatus 200, as the optical channels 240 may be maintained despite failures occurring in the primary laser sources 130-1, 130-4 and/or the secondary laser sources 115. However, alternate implementations may include an optical distributor that is not optically coupled with both a primary laser source 130-1, . . . , 130-4 and a secondary laser source 115.

In some embodiments, a complete overlap exists between different secondary laser sources 115. As shown, each optical distributor of the photonic chip 105 (e.g., the MMIs 230) that is optically coupled with the single mode laser source 210 is also optically coupled with the tunable laser source 215. Beneficially, such a configuration improves the reliability of the apparatus 200, as the optical channels 240 may be maintained despite failures occurring in the primary laser sources 130-1, . . . , 130-4 and/or the secondary laser sources 115. However, alternate implementations may include an optical distributor that is not optically coupled with different secondary laser sources 115. For example, some of the optical distributors may be optically coupled with one secondary laser source 115, and others of the optical distributors may be optically coupled with another secondary laser source 115.

Control circuitry of the sparing system 110 is configured to detect a failed primary laser source 130-1, . . . , 130-4 and to control a secondary laser source 115 to selectively provide optical energy to the optical distributor (here, an MMI 230) that is optically coupled with the failed primary laser source 130-1, . . . , 130-4. In some embodiments, the control circuitry is further configured to select which secondary laser source 115, of multiple secondary laser sources 115 optically coupled with the MMI 230, will provide the optical energy to the MMI 230.

The control circuitry may select the secondary laser source 115 according to any suitable criteria relating to the secondary laser sources 115 and/or to the optical distributors optically coupled therewith. In some embodiments, the secondary laser source 115 is selected to match a type of the failed primary laser source 130-1, . . . , 130-4. For example, both the primary laser source 130-1, . . . , 130-4 and the secondary laser source 115 may be single mode laser sources. In some embodiments, the secondary laser source 115 is selected to minimize an overall power consumption of the sparing system 110. In one example, one type of secondary laser source 115 is selected as having less power consumption than another type of secondary laser source 115. In another example, using a particular secondary laser source 115 to provide optical energy to multiple MMIs 230 has less power consumption than activating another secondary laser source 115. In some embodiments, the secondary laser source 115 is selected as having improved performance relative to another secondary laser source 115. In some embodiments, the secondary laser source 115 is selected based on the operational status of other secondary laser sources 115. For example, a secondary laser source 115 that is activated and providing optical energy to another MMI 230 may not be selected to provide optical energy to the MMI 230 with the failed primary laser source 130-1, . . . , 130-4. In some embodiments, an already activated secondary laser source 115 may be switched from one MMI 230 to another MMI 230 responsive to the failed primary laser source 130-1, . . . , 130-4. In some embodiments, the secondary laser source 115 is selected based on load balancing or operational wear considerations. In many cases, it is important to match the wavelength and power of the second laser source 115 with the failed primary laser source 130-1, . . . , 130-4. In embodiments of the sparing system 110 that use a wavelength demultiplexer 225, the wavelength of the corresponding secondary laser source 115 is selected to match the laser position that is being spared. The power of the secondary laser source 115 may be monitored (e.g., the laser bias may be included in a control loop with the monitor to maintain a constant power level).

Alternate arrangements of the sparing system 110 are also possible. As shown, the sparing system 110 comprises two different secondary laser sources 115—the single mode laser source 210 and the tunable laser source 215. In one alternate embodiment, the sparing system 110 may include multiple secondary laser sources 115 of a same type (e.g., multiple single mode laser sources 210). In another alternate embodiment, the sparing system 110 may include an alternate type of secondary laser source 115, such as a switchable laser source that is configured to selectively provide optical energy onto one or more outputs. In another alternate embodiment, the sparing system 110 may include a different number of secondary laser sources 115, such as a single secondary laser source 115 or three or more secondary laser sources 115.

The photonic chip 105 comprises sixteen (16) optical transceiver modules 155-1, . . . , 155-16, although other numbers are also possible. Each optical transceiver module 155-1, . . . , 155-16 is configured to receive optical energy from one of the MMIs 230-1, . . . 230-4. Each optical transceiver module 155-1, . . . , 155-16 is configured to output a modulated optical signal 235-1, . . . , 235-16 on a respective one of the output optical fibers 160.

Figure 3:
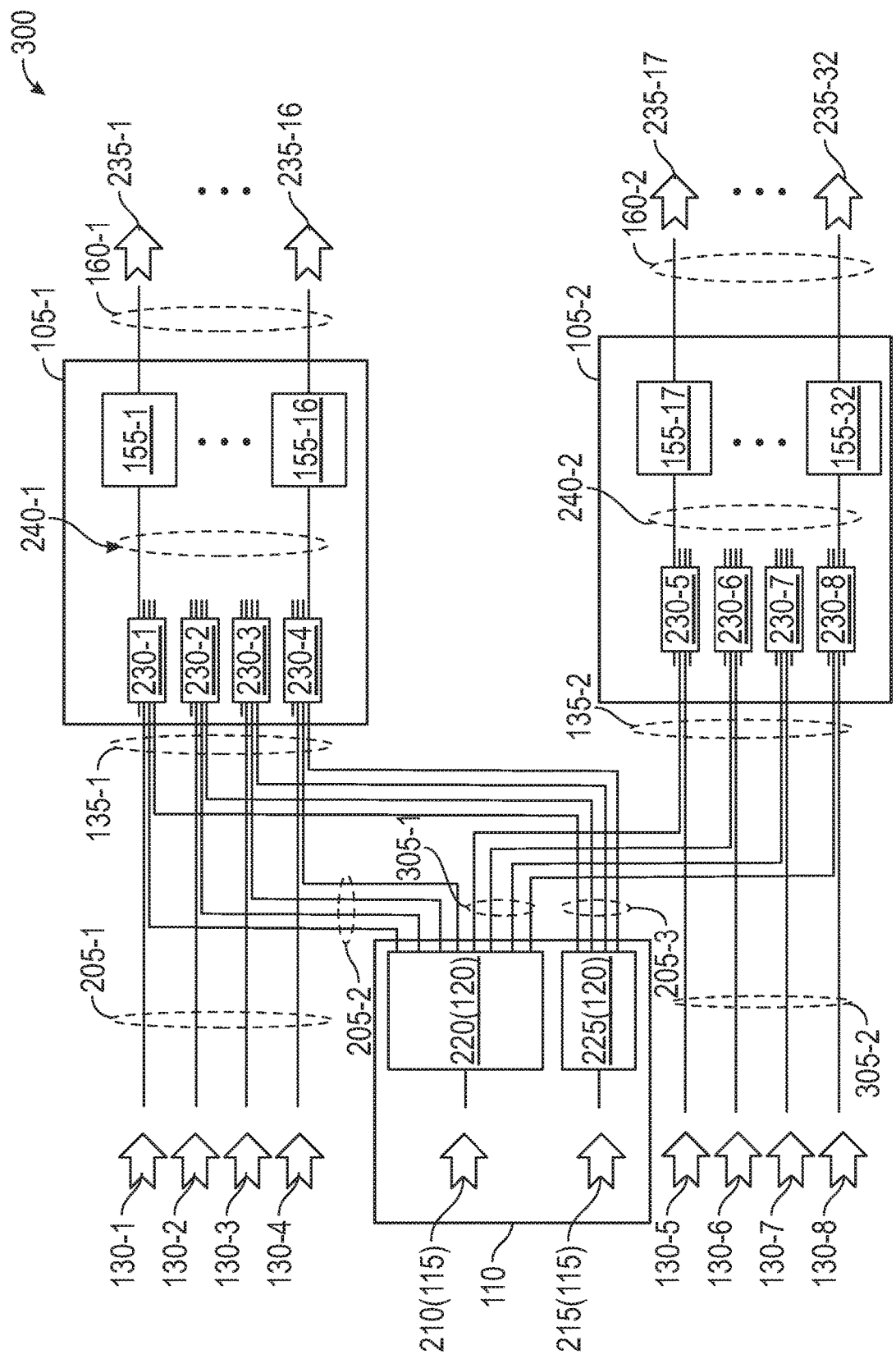
FIG. 3 is a diagram of an exemplary apparatus having a sparing system with secondary laser sources common to a plurality of photonic chips, according to one or more embodiments.

FIG. 3 is a diagram of an exemplary apparatus 300 having a sparing system 110 with secondary laser sources 115 common to a plurality of photonic chips 105-1, 105-2, according to one or more embodiments. More specifically, the apparatus 300 represents one possible implementation of the apparatus 100 of FIG. 1. As shown, the apparatus 300 comprises two photonic chips 105-1, 105-2 each supporting sixteen (16) optical channels 240-1, 240-2 using a respective four (4) primary laser sources 130-1 to 130-4, 130-5 to 130-8. Collectively, the apparatus 300 supports thirty-two (32) optical channels using eight (8) primary laser sources 130-1, . . . ,130-8, although different numbers of primary laser sources and/or optical channels are also possible. The primary laser sources 130-1, . . . , 130-8 are implemented separate from the photonic chips 105-1, 105-2.

The primary laser sources 130-1, . . . , 130-4 are optically coupled with MMIs 230-1, . . . , 230-4 via a first set 205-1 of the input optical fibers 135-1. The primary laser sources 130-5, . . . , 130-8 are optically coupled with MMIs 230-5, . . . , 230-8 via a second set 305-2 of the input optical fibers 135-2. As shown, each of the MMIs 230-1, . . . , 230-8 are in a 4×4 configuration (i.e., four inputs and four outputs), although other configurations are possible.

The sparing system 110 comprises two secondary laser sources 115. More specifically, the sparing system 110 comprises a single mode laser source 210 and a tunable laser source 215. Thus, apparatus 300 represents a laser sparing scheme of two secondary laser sources 115 to eight primary laser sources 130 (2:8).

The optical switch 220 is optically coupled with the single mode laser source 210, and a wavelength demultiplexer 225 is optically coupled with the tunable laser source 215. The outputs of the optical switch 220 are optically coupled with each of the MMIs 230-1, . . . , 230-4 via a second set 205-2 of the input optical fibers 135-1, and with each of the MMIs 230-5, . . . , 230-8 via a first set 305-1 of the input optical fibers 135-2. The outputs of the wavelength demultiplexer 225 are optically coupled with the MMIs 230-1, . . . , 230-4 via a third set 205-3 of the input optical fibers 135-1.

Notably, the optical switch 220 comprises eight (8) outputs and is optically coupled with both of the photonic chips 105-1, 105-2 while the wavelength demultiplexer 225 comprises four (4) outputs and is optically coupled with only the photonic chip 105-1. In this way, a complete overlap exists between the primary laser sources 130-1, . . . , 130-8 and the secondary laser sources 115, and a partial overlap exists between the different secondary laser sources 115 (i.e., the optical couplings with the photonic chip 105-1).

Alternate arrangements of the sparing system 110 are also possible. As shown, the sparing system 110 comprises two different secondary laser sources 115—the single mode laser source 210 and the tunable laser source 215. In one alternate embodiment, the sparing system 110 may include multiple secondary laser sources 115 of a same type (e.g., multiple single mode laser sources 210). In another alternate embodiment, the sparing system 110 may include an alternate type of secondary laser source 115, such as a switchable laser source that is configured to selectively provide optical energy onto one or more outputs. In another alternate embodiment, the sparing system 110 may include a different number of secondary laser sources 115, such as a single secondary laser source 115 or three or more secondary laser sources 115.

Each of the photonic chips 105-1, 105-2 comprises sixteen (16) optical transceiver modules 155-1 to 155-16, 155-17 to 155-32 although other numbers are also possible. Each optical transceiver module 155-1, . . . , 155-16 is configured to receive optical energy from one of the MMIs 230-1, . . . 230-4, and each optical transceiver module 155-17, . . . , 155-32 is configured to receive optical energy from one of the MMIs 230-5, . . . 230-8. Each optical transceiver module 155-1, . . . , 155-32 is configured to output a modulated optical signal 235-1, . . . , 235-32 on a respective one of the output optical fibers 160-1, 160-2.

As discussed above, control circuitry of the sparing system 110 may select a secondary laser source 115 to provide optical energy to an optical distributor (e.g., an MMI 230) associated with a failed primary laser source 130 according to any suitable criteria relating to the secondary laser sources 115 and/or to the optical distributors optically coupled therewith. In some embodiments, the secondary laser source 115 is selected based on the operational status of other secondary laser sources 115. For example, assume that the primary laser source 130-2 has previously failed and the sparing system 110 has selected the single mode laser source 210 to provide optical energy to the MMI 230-2. If the primary laser source 130-6 subsequently fails, the tunable laser source 215 cannot be selected as the secondary laser source 115 for the MMI 230-6 as the MMI 230-6 is not optically coupled with the tunable laser source 215. Thus, the sparing system 110 may transition the selection for the MMI 230-2 to the tunable laser source 215, and may transition the single mode laser source 210 to provide optical energy to the MMI 230-6.

Figure 4:
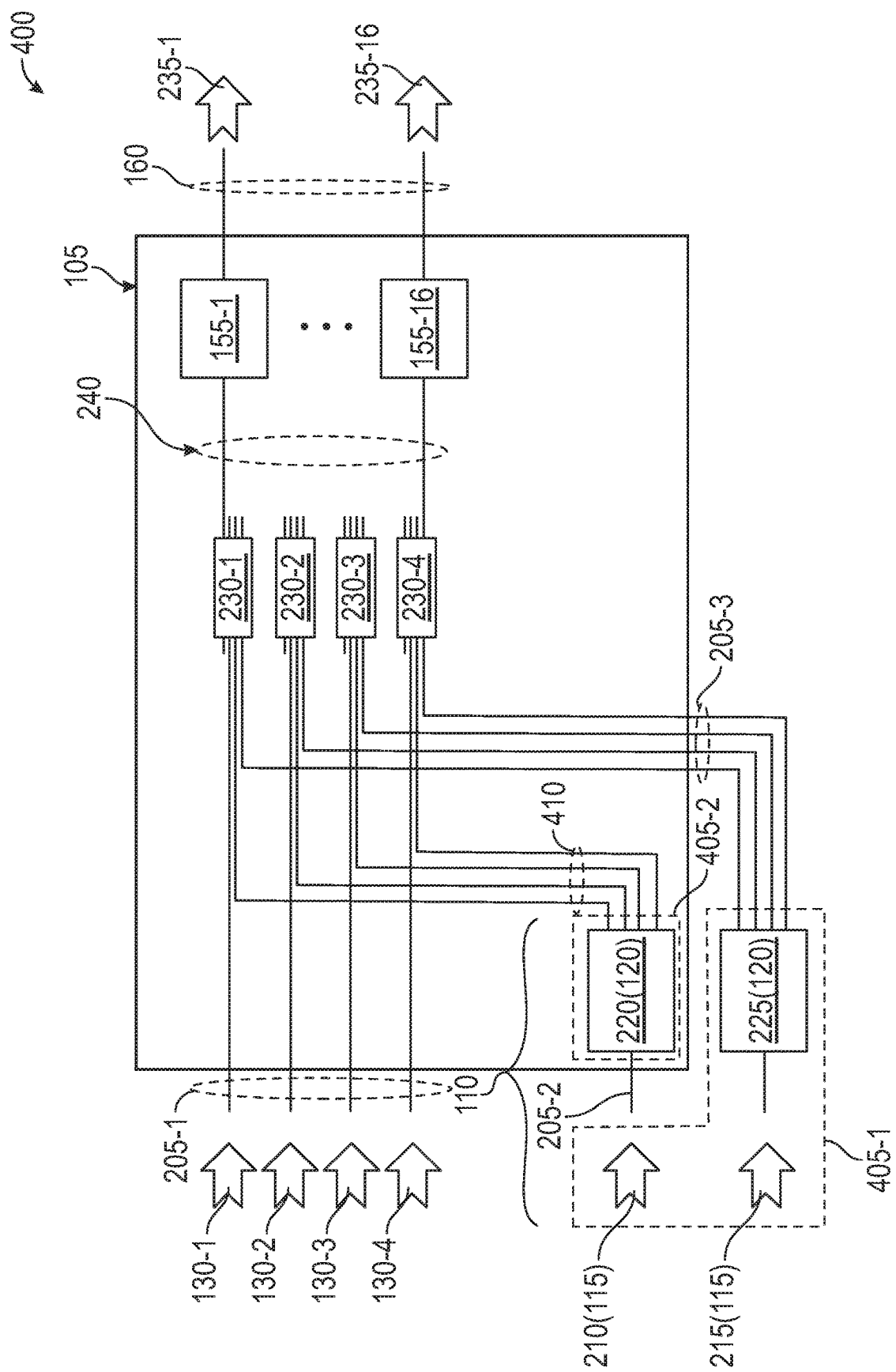
FIG. 4 is a diagram of an exemplary apparatus having a portion of a sparing system included on a photonic chip, according to one or more embodiments.

FIG. 4 is a diagram of an exemplary apparatus 400 having a portion 405-2 of a sparing system 110 included on a photonic chip 105, according to one or more embodiments. More specifically, the apparatus 400 represents one possible implementation of the apparatus 100 of FIG. 1. As shown, the apparatus 400 supports sixteen (16) optical channels 240 using four (4) primary laser sources 130-1, . . . , 130-4, although different numbers of primary laser sources and/or optical channels are also possible. The primary laser sources 130-1, . . . , 130-4 are implemented separate from the photonic chip 105, and are optically coupled with the MMIs 230-1, . . . , 230-4 via a first set 205-1 of a plurality of optical fibers.

A first portion 405-1 of the sparing system 110 is implemented separate from the photonic chip 105, and a second portion 405-2 of the sparing system 110 is implemented on the photonic chip 105. More specifically, the optical switch 220 is implemented on the photonic chip 105 and is optically coupled with the MMIs 230-1, . . . , 230-4 via a plurality of optical waveguides 410. The single mode laser source 210 is optically coupled with the optical switch 220 via a second set 205-2 of the plurality of optical fibers. The wavelength demultiplexer 225 is implemented separate from the photonic chip 105 and optically coupled with the MMIs 230-1, . . . , 230-4 via a third set 205-3 of optical fibers.

Beneficially, by implementing at least the portion 405-2 of the sparing system 110 on the photonic chip 105, even fewer optical fibers can support a particular number of optical channels 240. As shown, nine (9) optical fibers support the connection of the MMIs 230-1, . . . , 230-4 with the primary laser sources 130-1, . . . , 130-4 and with multiple secondary laser sources 115. In another embodiment, the wavelength demultiplexer 225 is also included in the portion 405-2 that is implemented on the photonic chip 105. In such a case, as few as six (6) optical fibers support the connection of the MMIs 230-1, . . . , 230-4 with the primary laser sources 130-1, . . . , 130-4 and with multiple secondary laser sources 115. As a result, costs and/or complexity associated with the apparatus 400 may be reduced.

Figure 5:
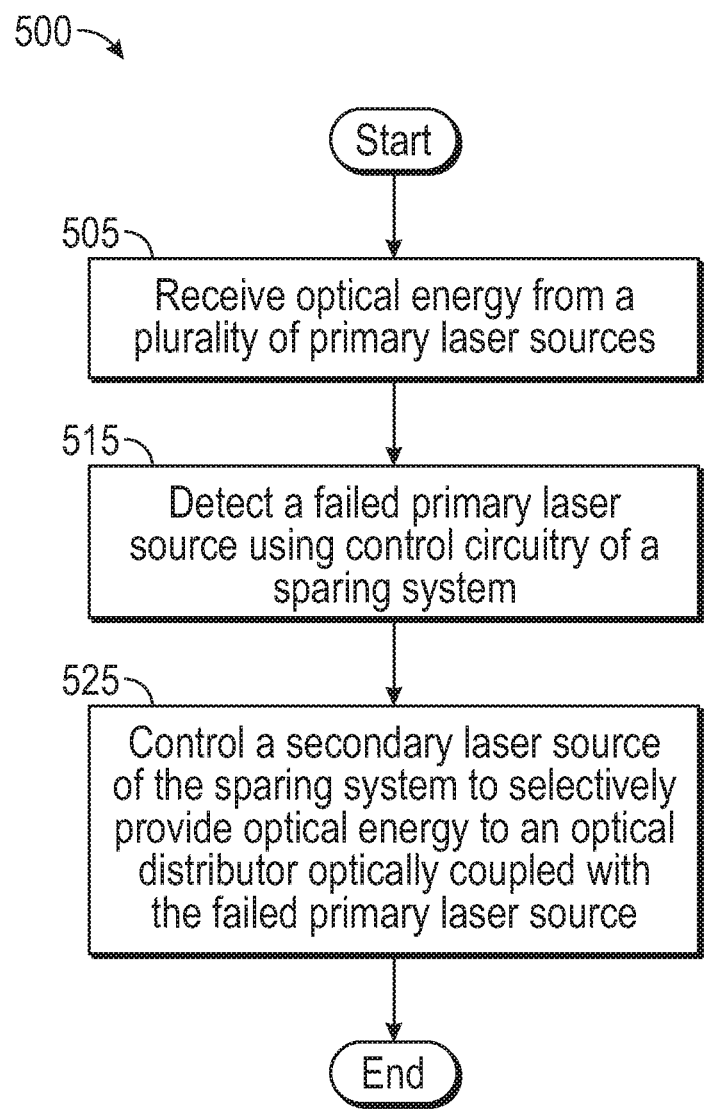
FIG. 5 is an exemplary method for use with a photonic chip, according to one or more embodiments.

FIG. 5 is an exemplary method 500 for use with a photonic chip, according to one or more embodiments. The method 500 may be used in conjunction with other embodiments, such as any of the apparatuses 100, 200, 300, 400 of FIGS. 1-4.

The method 500 begins at block 505, where optical energy is received from a plurality of primary laser sources. In some embodiments, the optical energy is received at optical distributors of the photonic chip. Each optical distributor comprises a plurality of inputs and at least one output, which in some cases may be optically coupled with an optical transceiver module.

At block 515, a failed primary laser source is detected using control circuitry of a sparing system. In some embodiments, the sparing system comprises a plurality of secondary laser sources, and at least a first one of the secondary laser sources is optically coupled with at least two of the optical distributors.

At block 525, a secondary laser source of the sparing system is controlled to selectively provide optical energy to the optical distributor whose first input is optically coupled with the failed primary laser source. The method 500 ends following completion of block 525.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An apparatus comprising:
    a photonic chip comprising:
        a plurality of optical distributors, wherein each of the plurality of optical distributors comprises:
            a first input and a second input; and
            one or more outputs, wherein optical energy received via the first input and via the second input is output on the one or more outputs;
        a plurality of primary laser sources, wherein the first input of each of the plurality of optical distributors is optically coupled with a respective primary laser source; and
        a sparing system comprising:
            one or more secondary laser sources, wherein the second input of each of the plurality of optical distributors is optically coupled with a respective secondary laser source, wherein a first one of the one or more secondary laser sources is optically coupled with at least two of the plurality of optical distributors; and
            control circuitry configured to, responsive to detecting a failed primary laser source of the plurality of primary laser sources, control the first one of the one or more secondary laser sources to selectively provide optical energy to an optical distributor whose first input is optically coupled with the failed primary laser source.

2. The apparatus of claim 1, wherein the plurality of optical distributors comprise at least one of a multimode interferometer and an optical multiplexer.

3. The apparatus of claim 1, wherein each of the one or more secondary laser sources is optically coupled with each of the plurality of optical distributors.

4. The apparatus of claim 3, wherein the sparing system further comprises:
    one or more optical demultiplexers optically coupled with the one or more secondary laser sources.

5. The apparatus of claim 4, wherein the one or more optical demultiplexers comprises a wavelength demultiplexer,
    wherein the one or more secondary laser sources comprises a tunable laser source, and
    wherein the control circuitry is configured to control a wavelength of the tunable laser source to selectively provide the optical energy to the optical distributor whose first input is optically coupled with the failed primary laser source.

6. The apparatus of claim 4, wherein the one or more optical demultiplexers comprises an optical switch, and
    wherein the control circuitry is configured to control the optical switch to selectively provide the optical energy to the optical distributor whose first input is optically coupled with the failed primary laser source.

7. The apparatus of claim 4, wherein a first demultiplexer of the one or more optical demultiplexers is included in the photonic chip.

8. The apparatus of claim 4, wherein the one or more optical demultiplexers comprise:
    a first optical demultiplexer of a first type; and
    a second optical demultiplexer of a different, second type.

9. The apparatus of claim 1, wherein the photonic chip further comprises:
    a plurality of optical transmitter modules, wherein each of the plurality of optical transmitter modules comprises circuitry that is optically coupled with an output of a respective optical distributor.

10. The apparatus of claim 1, further comprising:
    a second photonic chip comprising:
        a plurality of second optical distributors, wherein each of the plurality of second optical distributors comprises a first input and a second input, wherein the first input of each of the plurality of second optical distributors is optically coupled with a respective primary laser source,
    wherein the second input of each of the plurality of second optical distributors is optically coupled with a respective secondary laser source of the sparing system.

11. A photonic chip comprising:
    a substrate comprising a semiconductor material;
    a plurality of optical transceiver modules formed in the substrate;
    a plurality of optical distributors formed in the substrate, wherein each of the optical distributors comprises:
        a first input configured to optically couple with a respective primary laser source of a plurality of primary laser sources;
        a second input configured to optically couple with a respective secondary laser source of one or more secondary laser sources; and
        an output configured to provide optical energy received via the first input and via the second input to a respective one of the plurality of optical transceiver modules,
    wherein at least two of the plurality of optical distributors are configured to optically couple with a common secondary laser source, and
    control circuitry formed in the substrate, wherein the control circuitry is configured to, responsive to detecting a failed primary laser source of the plurality of primary laser sources, control the common secondary laser source to selectively provide optical energy to an optical distributor whose first input is optically coupled with the failed primary laser source.

12. The photonic chip of claim 11, wherein the plurality of optical distributors comprise at least one of a multimode interferometer and an optical multiplexer.

13. The photonic chip of claim 11, wherein each of the plurality of optical distributors is configured to optically couple with each of the one or more secondary laser sources.

14. The photonic chip of claim 13, further comprising:
one or more optical demultiplexers configured to optically couple with the one or more secondary laser sources.

15. The photonic chip of claim 14, wherein the one or more optical demultiplexers comprises a wavelength demultiplexer,
wherein the one or more secondary laser sources comprises a tunable laser source, and
wherein the control circuitry is configured to control a wavelength of the tunable laser source to selectively provide the optical energy to the optical distributor whose first input is optically coupled with the failed primary laser source.

16. The photonic chip of claim 14, wherein the one or more optical demultiplexers comprises an optical switch, and
wherein the control circuitry is configured to control the optical switch to selectively provide the optical energy to the optical distributor whose first input is optically coupled with the failed primary laser source.

17. The photonic chip of claim 14, wherein the one or more optical demultiplexers comprise:
a first optical demultiplexer of a first type; and
a second optical demultiplexer of a different, second type.

18. A method comprising:
receiving, at a plurality of optical distributors of a photonic chip, optical energy from a plurality of primary laser sources, wherein each of the plurality of optical distributors receives optical energy from a respective primary laser source at a respective first input;
detecting a failed primary laser source of the plurality of primary laser sources using control circuitry of a sparing system, wherein the sparing system further comprises one or more secondary laser sources configured to provide optical energy to respective second inputs of the plurality of optical distributors, wherein a first one of the one or more secondary laser sources is optically coupled with at least two of the plurality of optical distributors;
controlling, using the control circuitry, a first one of the one or more secondary laser sources to selectively provide optical energy to an optical distributor whose first input is optically coupled with the failed primary laser source; and
distributing the optical energy received via the first inputs and the second inputs on one or more respective outputs of each of the plurality of optical distributors.

19. The method of claim 18, wherein the sparing system further comprises a wavelength demultiplexer,
wherein the first one of the one or more secondary laser sources comprises a tunable laser source, and
wherein controlling the first one of the one or more secondary laser sources comprises controlling a wavelength of the tunable laser source to selectively provide the optical energy to the optical distributor whose first input is optically coupled with the failed primary laser source.

20. The method of claim 18, wherein the sparing system further comprises an optical switch, and
wherein controlling the first one of the one or more secondary laser sources comprises controlling the optical switch to selectively provide the optical energy to the optical distributor whose first input is optically coupled with the failed primary laser source.

* * * * *

UNITED STATES PATENT AND TRADEMARK OFFICE
CERTIFICATE OF CORRECTION

PATENT NO. : 10,725,240 B2
APPLICATION NO. : 16/132109
DATED : July 28, 2020
INVENTOR(S) : Jock T. Bovington et al.

Page 1 of 1

It is certified that error appears in the above-identified patent and that said Letters Patent is hereby corrected as shown below:

In the Specification

In Column 7, Line 40, after "130-1," insert -- . . . , --.

Signed and Sealed this
Twenty-second Day of September, 2020

Andrei Iancu
*Director of the United States Patent and Trademark Office*